US009318514B2

(12) United States Patent  
Kim et al.

(10) Patent No.: US 9,318,514 B2  
(45) Date of Patent: Apr. 19, 2016

(54) DISPLAY DEVICE AND METHOD OF MANUFACTURING THE SAME

(71) Applicant: LG Display Co., Ltd., Seoul (KR)

(72) Inventors: Hyeonwoo Kim, Busan (KR); JongHyun Park, Busan (KR); SungHun Jung, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 90 days.

(21) Appl. No.: 14/334,420

(22) Filed: Jul. 17, 2014

(65) Prior Publication Data

US 2015/0103265 A1 Apr. 16, 2015

(30) Foreign Application Priority Data

Oct. 14, 2013 (KR) .......................... 10-2013-0121705

(51) Int. Cl.
*G02F 1/1335* (2006.01)
*G02F 1/1343* (2006.01)
*G02F 1/1333* (2006.01)
*H01L 27/12* (2006.01)
*G06F 3/041* (2006.01)

(52) U.S. Cl.
CPC ........ *H01L 27/1259* (2013.01); *G02F 1/13338* (2013.01); *G06F 3/0412* (2013.01); *G02F 2001/134318* (2013.01); *G02F 2001/134372* (2013.01)

(58) Field of Classification Search
CPC ................. G02F 1/13338; G02F 2001/13312; G02F 1/134363; G02F 1/133707; G02F 1/136213; G02F 1/1333; G02F 1/133305; G02F 1/133351; G06F 3/0412; G06F 3/045; G06F 3/044
USPC ............................................ 349/12, 141, 158
See application file for complete search history.

(56) References Cited

U.S. PATENT DOCUMENTS

2010/0259503 A1* 10/2010 Yanase .................... G06F 3/044  
345/174  
2011/0050604 A1* 3/2011 Kwon .................... G06F 3/0412  
345/173

* cited by examiner

*Primary Examiner* — Mike Qi  
(74) *Attorney, Agent, or Firm* — Fenwick & West LLP

(57) ABSTRACT

Disclosed is a display device. The display device includes a gate line and a data line intersecting the gate line to define a pixel area on a substrate, a TFT formed in the pixel area and including a gate electrode, a semiconductor layer, a source electrode, and a drain electrode, a first protective layer formed on the TFT structured such that a first hole exists through the first protective layer, a second protective layer formed on the first protective layer and structured such that a second hole exists through the second protective layer, wherein the size of the second hole differs from a size of the first hole, a pixel electrode formed on the second protective layer and at least partially filling the first and second holes, the pixel electrode connected to the drain electrode through the first and second holes.

11 Claims, 14 Drawing Sheets

DISPLAY DEVICE AND METHOD OF MANUFACTURING THE SAME

CROSS-REFERENCE TO RELATED APPLICATIONS

This application claims the benefit of the Korean Patent Application No. 10-2013-0121705 filed on Oct. 14, 2013, which is incorporated by reference herein.

BACKGROUND

1. Field of the Invention

The present invention relates to a display device, and more particularly, to a display device including a sensing electrode that senses a user's touch.

2. Discussion of the Related Art

Various display devices, such as liquid crystal display (LCD) devices, plasma display panels (PDPs), and organic light emitting display devices, have been developed to date.

Traditional display devices often include a mouse or a keyboard as input means. However, a touch screen that enables a user to directly input information with a finger or a pen is often utilized in devices such as navigation systems, portable terminals, appliances, etc.

Hereinafter, an LCD device will be described in detail as an example of a related art display device with a touch screen applied thereto.

FIG. 1 is a schematic cross-sectional view of a related art LCD device.

As seen in FIG. 1, the related art LCD device includes a liquid crystal panel 10 and a touch screen 20.

The liquid crystal panel 10 displays an image, and includes a lower substrate 12, an upper substrate 14, and a liquid crystal layer 16 formed between the substrates 12 and 14.

The touch screen 20 is formed on a top of the liquid crystal panel 10 to sense a user's touch, and includes a touch substrate 22, a first sensing electrode 24 formed at a bottom of the touch substrate 22, and a second sensing electrode 26 formed at a top of the touch substrate 22.

The first sensing electrode 24 is disposed in a horizontal direction at the bottom of the touch substrate 22, and the second sensing electrode 26 is disposed in a vertical direction at the top of the touch substrate 22. Therefore, when a user touches a certain position, a capacitance between the first and second electrodes 24 and 26 is changed at the touched position, and thus, the position touched by the user is sensed based on the varying capacitance.

However, separately providing the touch screen 20 at the top of the liquid crystal panel 10 increases a total thickness and the manufacturing costs of the device.

SUMMARY

Accordingly, the present invention is directed to provide a display device that substantially obviates one or more problems due to limitations and disadvantages of the related art.

The present invention provide a display device and a method of manufacturing the same in which a sensing electrode for sensing a user's touch is built into a display panel without a separate touch screen being provided at a top of the display panel. Thus, a thickness and the manufacturing cost are reduced relative to the related art.

Additional advantages and features of the invention will be set forth in part in the description which follows and will be apparent to those having ordinary skill in the art upon reading this disclosure. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a display device including: a gate line and a data line intersecting the gate line to define a pixel area on a substrate; a thin film transistor (TFT) formed in the pixel area, and including a gate electrode, a semiconductor layer, a source electrode, and a drain electrode; a first protective layer formed on the TFT, the first protective layer structured such that a first hole exists through the first protective layer; a second protective layer formed on the first protective layer, and structured such that a second hole exists through the second protective layer, wherein a size of the second hole through the second protective layer at a plane where the first and second protective layers contact each other differs from a size of the first hole through the first protective layer at the plane where the first and second protective layers contact each other; a pixel electrode formed on the second protective layer and at least partially filling the first and second holes, the pixel electrode connected to the drain electrode through the first and second holes; a third protective layer formed on the pixel electrode; a sensing line formed on the third protective layer; a fourth protective layer formed on the sensing line; and a common electrode formed on the fourth protective layer, and connected to the sensing line.

In another embodiment of the present invention, there is provided a method of manufacturing a display device including: forming a gate electrode and a gate pad on a substrate; forming a gate insulating layer on the gate electrode and the gate pad; forming a semiconductor layer on the gate insulating layer; forming a source electrode and a drain electrode on the semiconductor layer; forming a data pad on the gate insulating layer; forming a first protective layer on the source electrode, drain electrode, and data pad, and forming a second protective layer, the second protective layer structured such that a hole is formed through the second protective layer; forming an anti-etching layer on a portion of the first protective layer over the gate pad and the data pad; etching an area of the first protective layer through the hole in the second protective layer to complete a first contact hole through the first and second protective layers; removing the anti-etching layer; forming a pixel electrode on the second protective layer, the pixel electrode connected to the drain electrode through the first contact hole; forming a third protective layer on the pixel electrode; forming a sensing line on the third protective layer; forming a fourth protective layer on the sensing line; and forming a common electrode, connected to the sensing line, on the fourth protective layer.

In another aspect of the present invention, there is provided a method of manufacturing a display device including: forming a thin film transistor (TFT) on a substrate, the TFT comprising a gate electrode, a semiconductor layer, a source electrode, and a drain electrode; forming a first protective layer structured such that a first hole exists through the first and second protective layer exposing the drain electrode from the first protective layer; after the first protective layer is formed, forming a second protective layer structured such that a second hole exists through the second protective layer exposing the drain electrode from the first and second protective layers, the second hole having a different size than the first hole at a plane where the first and second protective layers contact each other; and forming a pixel electrode on the second protective layer, the pixel electrode connected to the drain electrode through the first and second holes; forming a third protective layer on the pixel electrode; forming a sensing line on the third protective layer; forming a fourth protective layer on the sensing line; and forming a common electrode, connected to the sensing line, on the fourth protective layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

The term "on" is used herein to describe an element directly in contact with another element, or to describe an element that is positioned over another element (in a cross-sectional view) with one or more intervening elements in between.

Modifiers "first" and "second" described herein do not denote the order of elements but are for differentiating corresponding elements.

Hereinafter, embodiments of the present invention will be described in detail with reference to the accompanying drawings.

Figure 1:
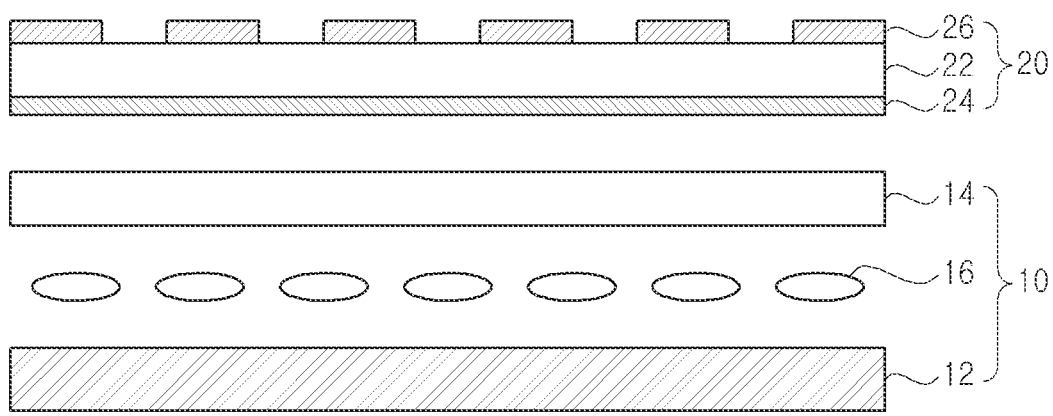
FIG. 1 is a schematic cross-sectional view of a related art LCD device.
Figure 2:
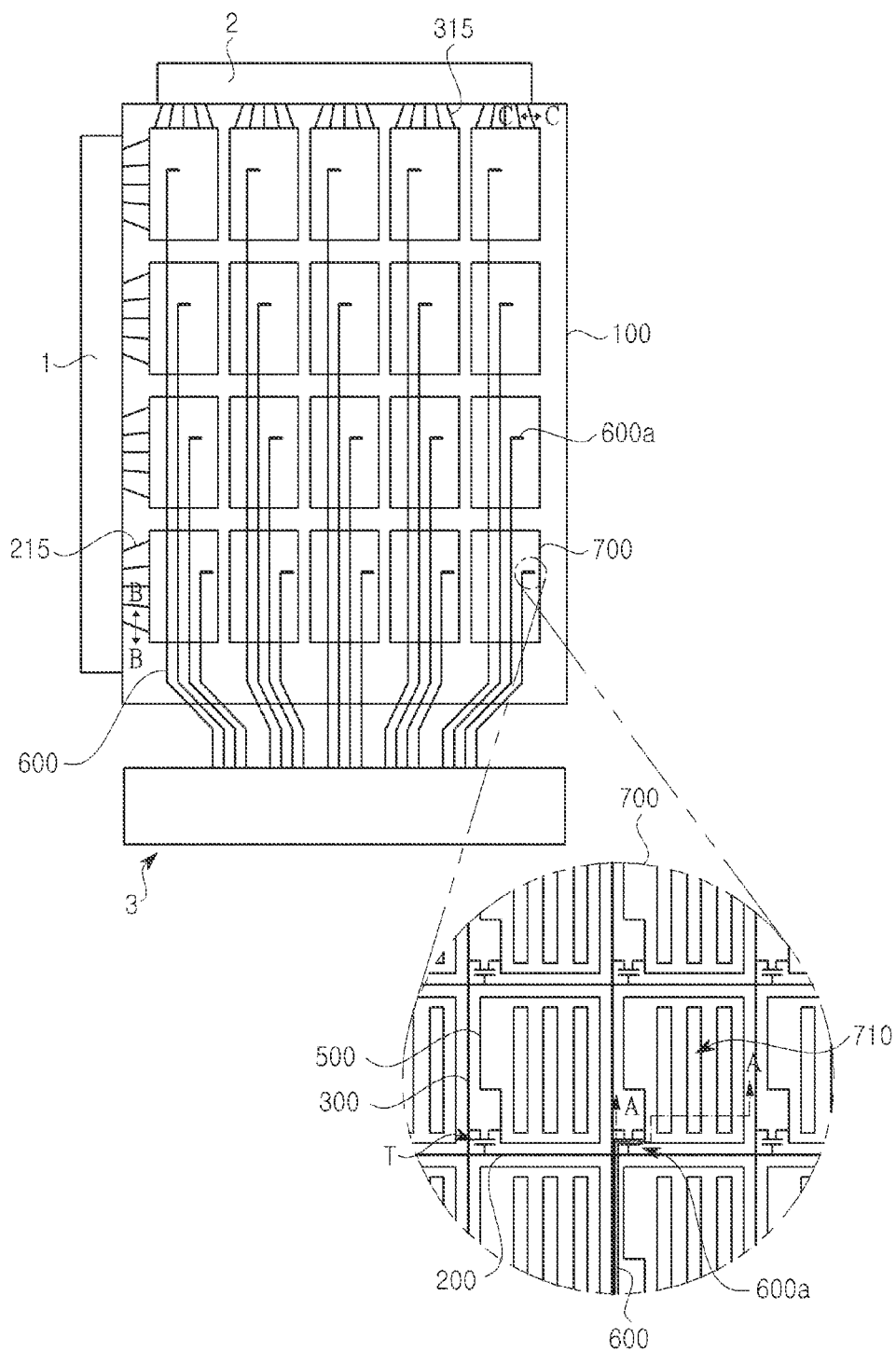
FIG. 2 is a schematic plan view of a substrate of a display device according to an embodiment of the present invention.

FIG. 2 is a schematic plan view of a substrate of a display device according to an embodiment of the present invention. For reference, in FIG. 2, an enlarged view referred to by an arrow shows a pixel area in which a sensing line 600 is electrically connected to a common electrode 700.

As seen in FIG. 2, the display device according to an embodiment of the present invention includes a substrate 100, a gate line 200, a data line 300, a thin film transistor (TFT) T, a pixel electrode 500, the sensing line 600, the common electrode 700, a gate driver 1, a data driver 2, and a touch driver 3.

The substrate 100 may be formed of glass or transparent plastic.

The gate line 200 is disposed in a first direction (for example, a horizontal direction) on the substrate 100. A gate pad 215 is formed at one end of the gate line 200, and is connected to the gate driver 1. Therefore, a gate signal applied from the gate driver 1 is transferred to the gate line 200 through the gate pad 215.

The data line 300 is disposed in a second direction (for example, a vertical direction), which differs from the first direction, on the substrate 100. Therefore, a plurality of the gate lines 200 and a plurality of the data lines 300 are arranged to intersect each other, thereby defining a plurality of pixel areas. A data pad 315 is formed at one end of the data line 300, and is connected to the data driver 2. Therefore, a data signal applied from the data driver 2 is transferred to the data line 300 through the data pad 315. The data lines 300 are illustrated as being arranged in a straight line, but may be arranged in a bent-line or a pattern of bent and/or straight lines such as a zigzag pattern.

The TFT T is a switching element, and is formed in each of the plurality of pixel areas. In detail, although not shown, the TFT T includes a gate electrode connected to the gate line 200, a semiconductor layer acting as a channel through which an electron moves, a source electrode connected to the data line 300, and a drain electrode formed to face the source electrode. The TFT T may be modified and formed as various types, which are known to those skilled in the art, such as a top gate structure or a bottom gate structure.

The pixel electrode 500 is formed in each of the plurality of pixel areas. The pixel electrode 500 is connected to a drain electrode of the TFT T.

The sensing line 600 is connected to the common electrode 700, and transfers a user touch signal sensed by the common electrode 700 to the touch driver 3. In order to transfer the user touch signal, a plurality of the sensing lines 600 are connected to a plurality of the common electrodes 700 in pairs. That is, the plurality of sensing lines 600 are connected to the plurality of common electrodes 700 in one-to-one correspondence relationships.

The sensing line 600 is formed to overlap the data line 300 to prevent a light transmittance from being reduced due to the sensing line 600. Also, the sensing line 600 includes a contact part 600a which protrudes to the TFT T area, and is connected to the common electrode 700 through the contact part 600a. The TFT T area is an area which cannot display an image, and has a broader width than that of the data line 300. The contact part 600a which protrudes from the sensing line 600 (which overlaps the data line 300) to the TFT T area is formed, and the contact part 600a is connected to the common electrode 700. Thus, a reliable connection between the sensing line 600 and the common electrode 700 may be achieved without any reduction in a light transmittance. That is, as seen in the below-described cross-sectional view, the sensing line 600 is connected to the common electrode 700 through a contact hole, and thus, a width of the sensing line 600 may have a certain range or more for a reliable connection between the sensing line 600 and the common electrode 700. Therefore, the contact part 600a is formed to have a broader width than that of the sensing line 600, and thus, the sensing line 600 is reliably connected to the common electrode 700.

The common electrode 700 acts as a sensing electrode which senses a user's touch position. Also, in an LCD device, the common electrode 700 generates an electric field with the pixel electrode 500 to drive liquid crystal. That is, the common electrode 700 may generate a fringe field with the pixel electrode 500. To this end, a plurality of slits 710 are formed at the common electrode 700. Therefore, the fringe field is generated between the pixel electrode 500 and the common electrode 700 through each of the slits 710, and an alignment direction of the liquid crystal may be adjusted by the fringe field. That is, an LCD device having a fringe field switching mode may be implemented.

Moreover, a plurality of the common electrodes 700 are arranged on the substrate 100 to be separated from each other by a certain distance so that each of the common electrodes 700 acts as the sensing electrode which senses a user's touch position. Each of the common electrodes 700 is formed to have a size corresponding to one or more pixel areas, and particularly, is formed to have a size corresponding to a plurality of pixel areas in consideration of a user's touch area.

The gate driver 1 receives a gate control signal from an external timing controller (not shown) to apply the gate signal to the gate line 200 through the gate pad 215. The gate driver 1 may have a tape carrier package (TCP) structure, a chip-on film (COF) structure, a chip-on glass (COG) structure which is mounted on the substrate 100, or a gate-in panel (GIP) structure which is formed directly on the substrate 100.

The data driver 2 receives a data control signal from the external timing controller (not shown) to apply the data signal to the data line 300 through the data pad 315. The data driver 2 may have the TCP structure, the COF structure, or the COG structure which is mounted on the substrate 100.

The touch driver 3 is connected to the sensing line 600, and receives the user touch signal from the sensing line 600. The touch driver 3 senses a capacitance change, caused by a user's touch, to determine whether a user's touch is present and detect a touched position.

Figure 3:
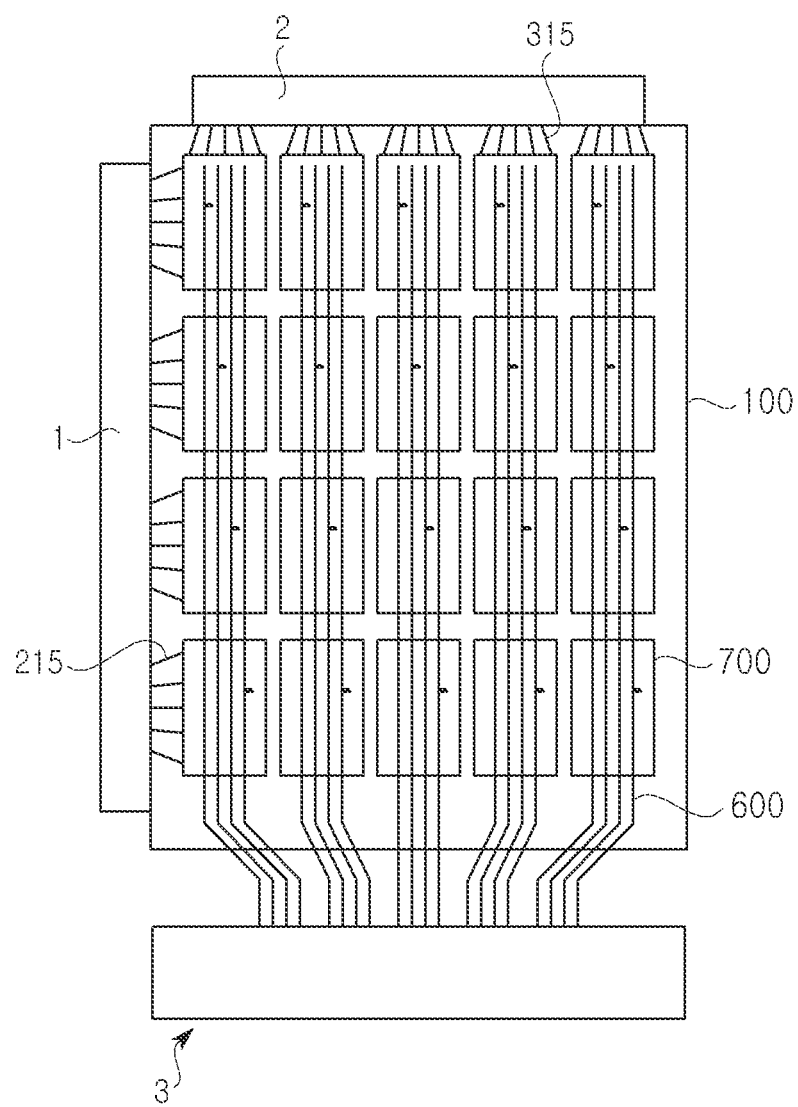
FIG. 3 is a schematic plan view of a lower substrate of a display device according to another embodiment of the present invention.

FIG. 3 is a schematic plan view of a lower substrate of a display device according to another embodiment of the present invention. Except for a different structure of the sensing line 600, the display device of FIG. 3 is the same as the above-described display device of FIG. 2. Therefore, like reference numerals refer to like elements throughout, and repetitive descriptions on the same elements are omitted below.

As seen in FIG. 3, according to another embodiment of the present invention, a plurality of sensing lines 600 are connected to a plurality of common electrodes 700 in one-to-one correspondence relationships. In particular, the plurality of sensing lines 600 are arranged at the same lengths in a display area that displays an image.

According to the above-described display device of FIG. 2, one end of the sensing line 600 is connected to the touch driver 1, and the other end of the sensing line 600 is connected to the contact part 600a. That is, according to FIG. 2, the sensing line 600 extends to only the contact part 600a connected to the common electrode 700, and thus, a length of the sensing line 600 connected to the common electrode 700 disposed on a first row is longer than that of the sensing line 600 connected to the common electrode 700 disposed on a second row.

On the other hand, according to the display device of FIG. 3, one end of the sensing line 600 is connected to a touch driver 1, and the other end of the sensing line 600 extends to an upper end of the common electrode 700 disposed on a first row. Therefore, according to FIG. 3, a length of the sensing line 600 connected to the common electrode 700 disposed on the first row is identically to that of the sensing line 600 connected to the common electrode 700 disposed on a second row, in a display area.

In comparison with a case of FIG. 2 in which the plurality of sensing lines 600 are formed to have different lengths in the display area, when the plurality of sensing lines 600 are formed to have the same length in the display area as in FIG. 3, a pattern consistency of the sensing lines 600 increases, thereby enhancing visibility.

Hereinafter, a display device according to an embodiment of the present invention will be described in detail by using a cross-sectional structure.

Figure 4:
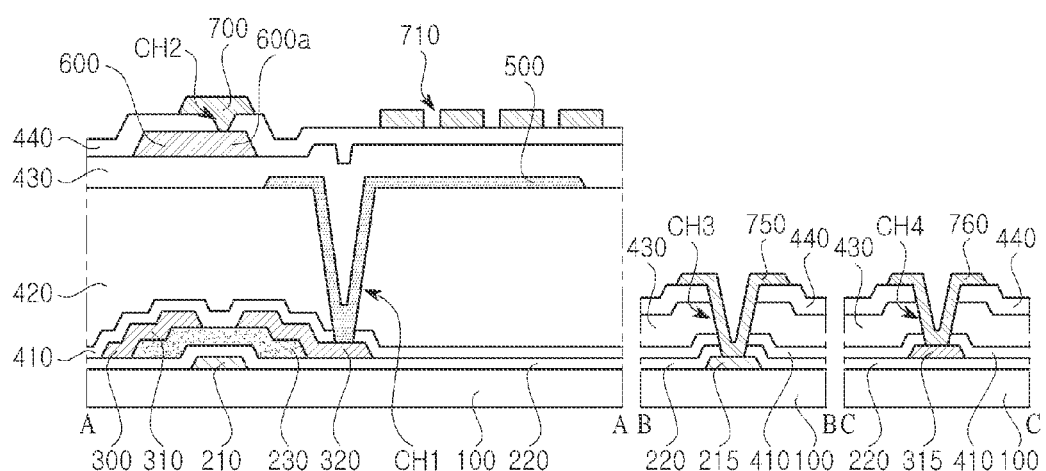
FIG. 4 is a cross-sectional view of a display device according to an embodiment of the present invention.

FIG. 4 is a cross-sectional view of a display device according to an embodiment of the present invention, and illustrates cross-sectional surfaces of line A-A, line B-B, and line C-C of FIG. 2. The line A-A of FIG. 2 shows a TFT area, the line B-B of FIG. 2 shows a gate pad area, and the line C-C of FIG. 2 shows a data pad area.

As seen in FIG. 4, a gate electrode 210 and a gate pad 215 are patterned on a substrate 100. The gate electrode 210 is formed in a TFT area, and the gate pad 215 is formed in a gate pad area. The gate electrode 210 may be formed to protrude from the above-described gate line 200, and the gate pad 215 is connected to one end of the gate line 200.

A gate insulating layer 220 is formed on the gate electrode 210 and the gate pad 215. The gate insulating layer 230 is formed all over the substrate 100 except a third contact hole CH3 area.

A semiconductor layer 230 and a data pad 315 are formed on the gate insulating layer 220. The semiconductor layer 230 is formed in the TFT area, and may be formed of a silicon-based semiconductor material or an oxide semiconductor material. The data pad 315 is formed in the data pad area, and is connected to one end of the above-described data line 300.

A source electrode 310 and a drain electrode 320 are patterned on the semiconductor layer 230. The source electrode 310 and the drain electrode 320 are formed in the TFT area. The source electrode 310 is connected to the data line 300, and the drain electrode 320 faces the source electrode 310 and is separated from the source electrode 310.

A first protective layer 410 is formed on the data line 300, the data pad 315, the source electrode 310, and the drain electrode 320. The first protective layer 410 is formed all over the substrate 100 except a first contact hole CH1 area, the third contact hole CH3 area, and a fourth contact hole CH4 area. The first protective layer 410 may be formed of an inorganic insulating material such as silicon nitride or silicon oxide.

A second protective layer 420 is formed on the first protective layer 410. The second protective layer 420 is formed in the TFT area, but may be omitted from (i.e., not formed) in the gate pad area and the data pad area. The second protective layer 420 may be formed of an organic insulating material such as an acrylic-based resin containing a photo active compound (PAC). The second protective layer 420 may be formed to have a greater thickness than that of the first protective layer 410 to planarize the substrate 100.

A pixel electrode 500 is patterned on the second protective layer 420. The pixel electrode 500 is formed in the TFT area. The pixel electrode 500 is connected to the drain electrode 320 through a first contact hole CH1. The first contact hole CH1 is formed by a combination of holes respectively formed in the first and second protective layers 410 and 420.

A third protective layer 430 is formed on the pixel electrode 500. The third protective layer 430 is formed all over the substrate 100 except the third contact hole CH3 area and the fourth contact hole CH4 area. The third protective layer 430 may be formed of an inorganic insulating material such as silicon nitride or silicon oxide.

A sensing line 600 including a contact part 600a is patterned on the third protective layer 430. The sensing line 600 is formed in the TFT area.

A fourth protective layer 440 is formed on the sensing line 600. The fourth protective layer 440 is formed all over the substrate 100 except a second contact hole CH2 area, the third contact hole CH3 area, and the fourth contact hole CH4 area.

The fourth protective layer 440 may be formed of an inorganic insulating material such as silicon nitride or silicon oxide.

A common electrode 700, a gate pad electrode 750, and a data pad electrode 760 are patterned on the fourth protective layer 440. The common electrode 700 is formed in the TFT area, the gate pad electrode 750 is formed in the gate pad area, and the data pad electrode 760 is formed in the data pad area.

The common electrode 700, the gate pad electrode 750, and the data pad electrode 760 are formed of the same material and on the same layer by the same process.

The common electrode 700 is patterned in order for a plurality of slits 710 to be included therein. The common electrode 700 is connected to the contact part 600a of the sensing line 600 through a second contact CH2 included in the fourth protective layer 440.

The gate electrode pad 750 is connected to the gate pad 215 through a third contact hole CH3 formed by a combination of holes which are respectively formed in the gate insulating layer 220, the first protective layer 410, the third protective layer 430, and the fourth protective layer 440.

The data electrode pad 760 is connected to the data pad 315 through a fourth contact hole CH4 formed by a combination of holes which are respectively formed in the first protective layer 410, the third protective layer 430, and the fourth protective layer 440.

Figure 5:
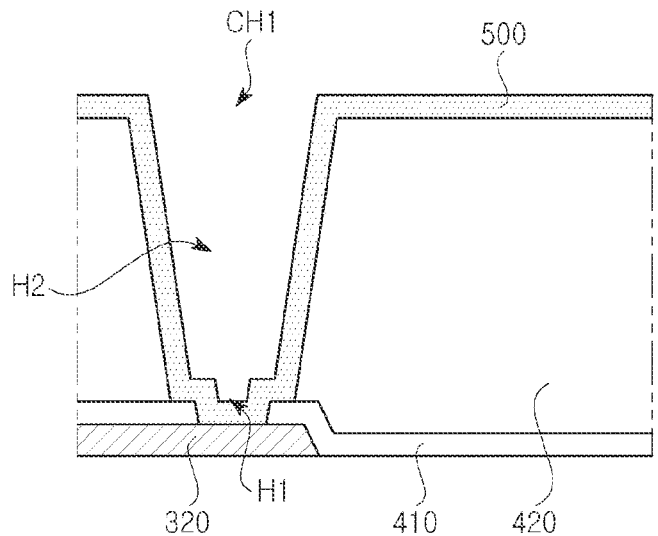
FIG. 5 is a cross-sectional view of a display device according to another embodiment of the present invention.
Figure 6:
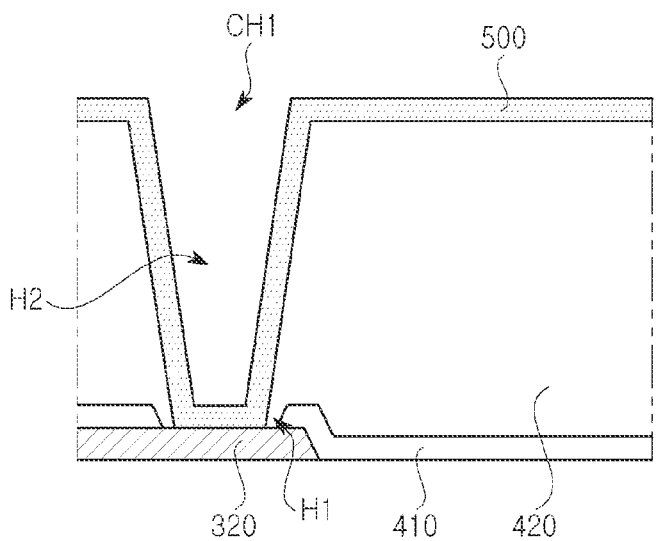
FIG. 6 is a cross-sectional view of a display device according to another embodiment of the present invention.

FIG. 5 is a cross-sectional view of a display device according to another embodiment of the present invention, and FIG. 6 is a cross-sectional view of a display device according to another embodiment of the present invention. FIGS. 5 and 6 show that a structure of the first contact hole CH1 may be variously changed in the display device of FIG. 4.

According to FIG. 4, the first contact hole CH1 is formed by the combination of the holes respectively formed in the first and second protective layers 410 and 420. In the embodiment of FIG. 4, the sizes (e.g., widths or diameters) of the holes through the first and second protective layers are the same at a plane where the first protective layer 410 contacts the second protective layer 420. Also, an inner surface of the first contact hole CH1 is formed as a substantially straight line from an upper end to a lower end, and thus, the first contact hole CH1 has a substantially cylindrical structure or a substantially conical structure.

On the other hand, according to FIGS. 5 and 6, the first protective layer 410 and second protective layer 420 are structured such that a size of a hole H1 through the first protective layer 410 differs from the size of a hole H2 through the second protective layer 420 when measured at the plane where the first protective layer 410 contacts the second protective layer 420.

In detail, according to FIG. 5, the size of the hole H1 formed at the first protective layer 410 is smaller than that of the hole H2 formed at the second protective layer 420 at the plane where the first protective layer 410 contacts the second protective layer 420. Therefore, the inner surface of the first contact hole CH1 is formed as a bent line from the upper end to the lower end. In this case, the pixel electrode 500 contacts a side of the second protective layer 420 and a top and side of the first protective layer 410.

According to FIG. 6, the size of the hole H1 formed at the first protective layer 410 is greater than that of the hole H2 formed at the second protective layer 420 at the plane where the first protective layer 410 contacts the second protective layer 420. Therefore, the inner surface configuring the first contact hole CH1 is formed as a straight line from the upper end to the lower end. In this case, the pixel electrode 500 contacts the side of the second protective layer 420, but does not contact the first protective layer 410.

The structures of FIGS. 5 and 6 may be obtained through a below-described method according to FIGS. 8A to 8I.

FIGS. 7A to 7J are schematic process cross-sectional views of a substrate of a display device according to an embodiment of the present invention, and relate to a process of manufacturing the substrate of the display device of FIG. 4.

Figure 7A:
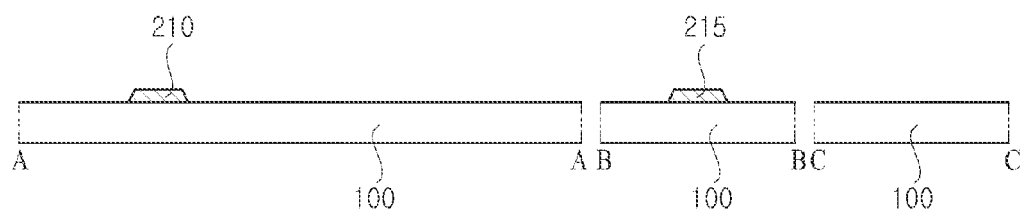
FIGS. 7A to 7J are schematic process cross-sectional views of a substrate of a display device according to an embodiment of the present invention.

First, as seen in FIG. 7A, a gate electrode 210 and a gate pattern 215 are patterned on a substrate 100. The gate electrode 210 is formed in a TFT area, and the gate pad 215 is formed in a gate pad area.

A thin layer may be deposited on the substrate 100 by a sputtering process, and then, the gate electrode 210 and the gate pad 215 may be patterned through a series of mask processes such as a photoresist coating process, an exposure process, a development process, an etching process, and a strip process. Hereinafter, a process of forming a pattern of below-described elements may be performed by using the thin layer depositing process and the series of mask processes.

Figure 7B:
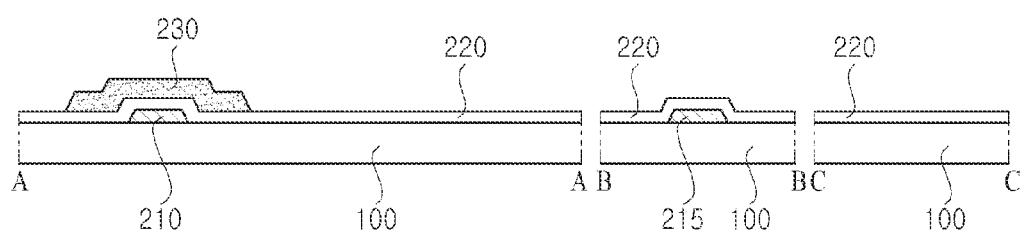

Subsequently, as seen in FIG. 7B, a gate insulating layer 220 is formed on the gate electrode 210 and the gate pad 215, and a semiconductor layer 230 is patterned on the gate insulating layer 220. The gate insulating layer 220 is formed all over the substrate 100 by a plasma enhanced chemical vapor deposition (PECVD) process, and the semiconductor layer 230 is formed in the TFT area.

Figure 7C:
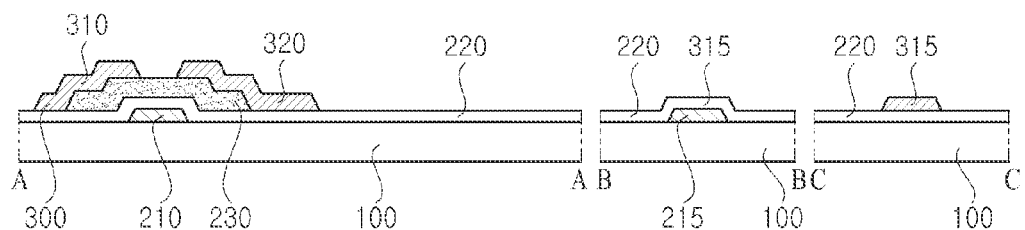

Subsequently, as seen in FIG. 7C, a source electrode 310 connected to a data line 300 and a drain electrode 320 are patterned on the semiconductor layer 230, and a data pad 315 is patterned on the gate insulating layer 220.

The source electrode 310 and the drain electrode 320 are formed in the TFT area, and the data pad 315 is formed in a data pad area.

Figure 7D:
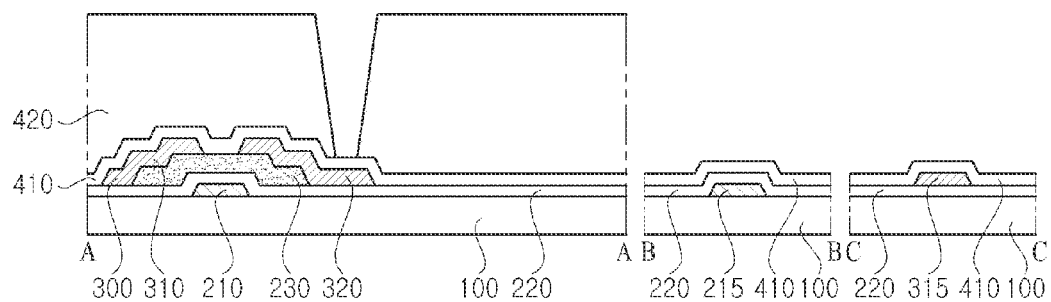

Subsequently, as seen in FIG. 7D, a first protective layer 410 is formed on the data line 300, the data pad 315, the source electrode 310, and the drain electrode 320, and a second protective layer 420 is patterned on the first protective layer 410.

The first protective layer 410 is formed all over the substrate 100 by the PECVD process.

The second protective layer 420 is formed in the TFT area. In detail, an organic insulating material containing a photo active compound (PAC) is coated all over the substrate 100, and then, the second protective layer 420 is patterned by an exposure process and a development process. The second protective layer 420 is patterned to include a hole configuring a first contact hole CH1.

Figure 7E:
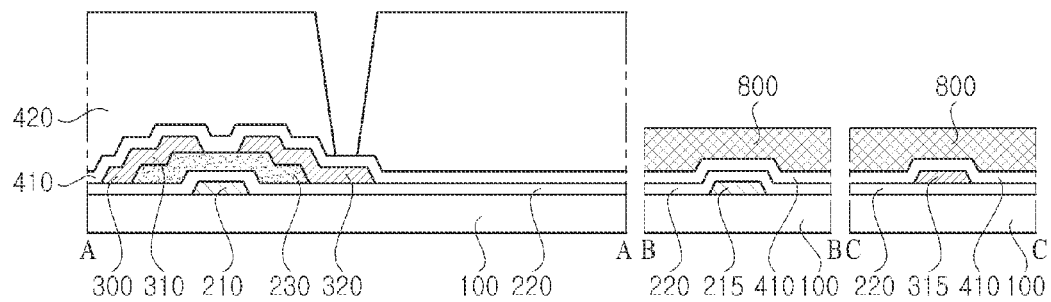

Subsequently, as seen in FIG. 7E, an anti-etch layer 800 is patterned on the first protective layer 410 in the gate pad area and data pad area. The anti-etching layer 800 prevents the gate pad area and the data pad area from being etched when the first protective layer 410 is etched for forming the first contact hole CH1 in a below-described process (a process of FIG. 7F). An organic insulating material containing a photo active compound (PAC) is coated all over the substrate 100, and then, the anti-etching layer 800 is patterned by an exposure process and a development process.

Figure 7F:
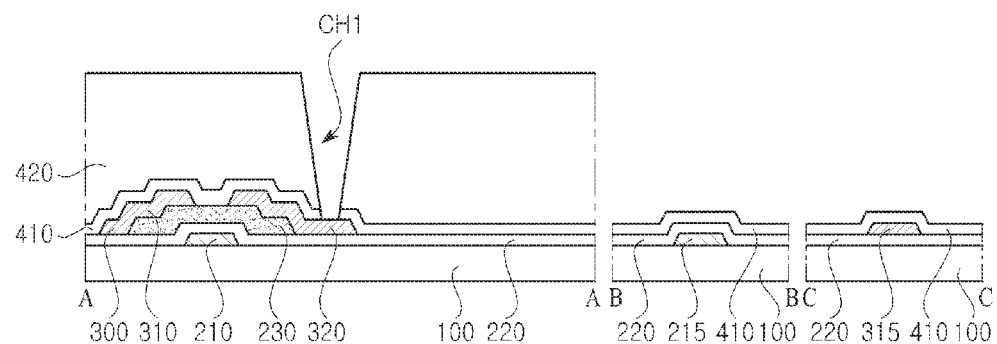

Subsequently, as seen in FIG. 7F, the first contact hole CH1 is completed by etching a first protective layer 410 area (i.e., the first protective layer 410 area exposed by the hole included in the second protective layer 420) corresponding to the first contact hole CH1 area, and the anti-etching layer 800 is removed.

The drain electrode 320 is exposed to the outside by the first contact hole CH1.

Figure 7G:
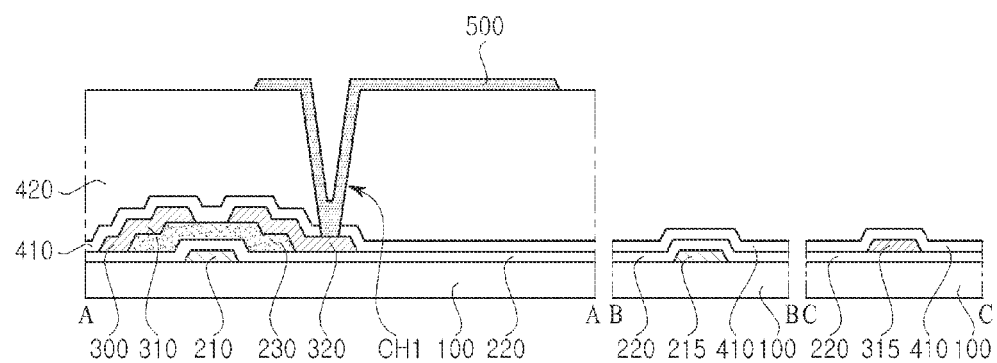

Subsequently, as seen in FIG. 7G, a pixel electrode 500 is patterned on the second protective layer 420. The pixel electrode 500 is patterned to be connected to the drain electrode 320 through the first contact hole CH1 in the TFT area.

Figure 7H:
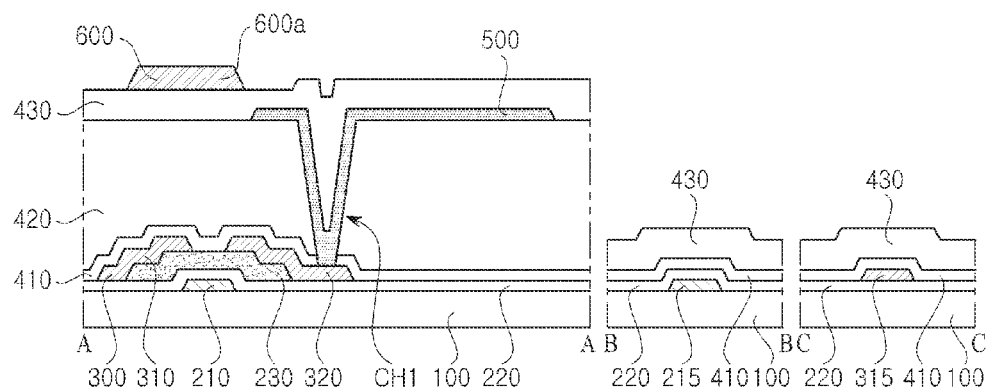

Subsequently, as seen in FIG. 7H, a third protective layer 430 is formed on the pixel electrode 500, and a sensing line 600 including a contact part 600a is patterned on the third protective layer 430.

The third protective layer 430 is formed all over the substrate 100 by the PVECVD process, and the sensing line 600 is patterned in the TFT area.

Figure 7I:
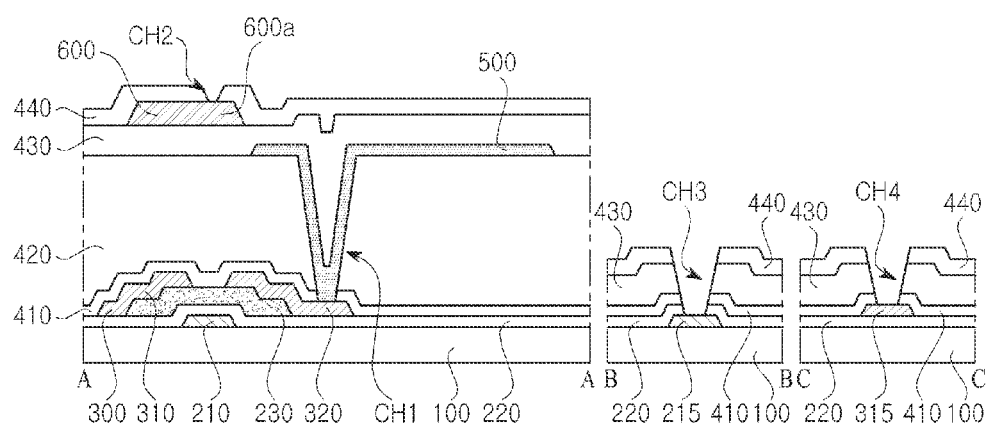

Subsequently, as seen in FIG. 7I, a fourth protective layer 440 is formed on the sensing line 600, and then, second to fourth contact holes CH2 to CH4 are formed.

The fourth protective layer 440 is formed all over the substrate 100 by the PVECVD process.

The second contact hole CH2 is formed by etching a certain area of the fourth protective layer 440, and the contact part 600a of the sensing line 600 is exposed to the outside by the second contact hole CH2.

The third contact hole CH3 is formed by etching a certain area of each of the gate insulating layer 220, first protective layer 410, third protective layer 430, and fourth protective layer 440, and the gate pad 215 is exposed to the outside by the third contact hole CH3.

The fourth contact hole CH4 is formed by etching a certain area of each of the first protective layer 410, third protective layer 430, and fourth protective layer 440, and the data pad 315 is exposed to the outside by the fourth contact hole CH4.

Figure 7J:
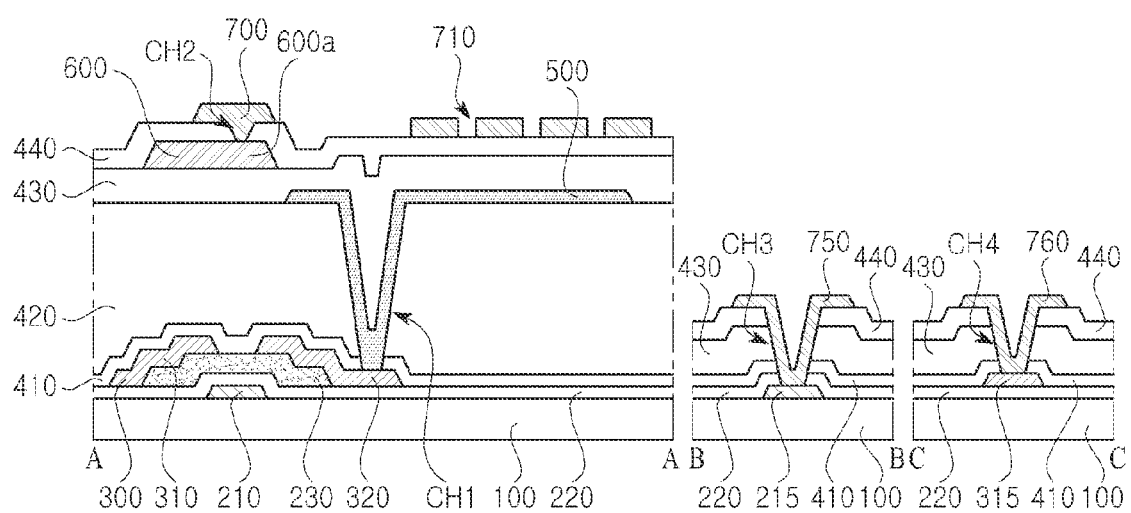

Subsequently, as seen in FIG. 7J, a common electrode 700, a gate pad electrode 750, and a data pad electrode 760 are patterned on the fourth protective layer 440.

The common electrode 700 is patterned in order for a plurality of slits 710 to be included therein, in the TFT area. In particular, the common electrode 700 is patterned to be connected to the contact part 600a of the sensing line 600 through the second contact CH2.

The gate pad electrode 750 is patterned to be connected to the gate pad 215 through the third contact hole CH3, in the gate pad area.

The data pad electrode 760 is patterned to be connected to the data pad 315 through the fourth contact hole CH4, in the data pad area.

According to the method of FIGS. 7A to 7J, when forming the anti-etching layer 800 in the above-described process of FIG. 7E, an organic insulating material forming the anti-etching layer 800 may remain in the first contact hole CH1 area. That is, an organic insulating material is coated all over the substrate 100, and then, the anti-etching layer 800 is patterned by the exposure process and the development process so that the organic insulating material remains in only the gate pad area and data pad area. In this case, an organic insulating material in the first contact hole CH1 area may remain without being removed by the development process. As described above, when the organic insulating material in the first contact hole CH1 area remains, the first protective layer 410 area corresponding to the first contact hole CH1 area is not etched in the process of FIG. 7F, and for this reason, the first contact hole CH1 is not formed.

A below-described method of FIGS. 8A to 8I relates to a method of reliably forming a first contact hole CH1.

FIGS. 8A to 8I are schematic process cross-sectional views of a substrate of a display device according to another embodiment of the present invention, and relate to a process of manufacturing a substrate for display devices of FIGS. 5 and 6.

Figure 8A:
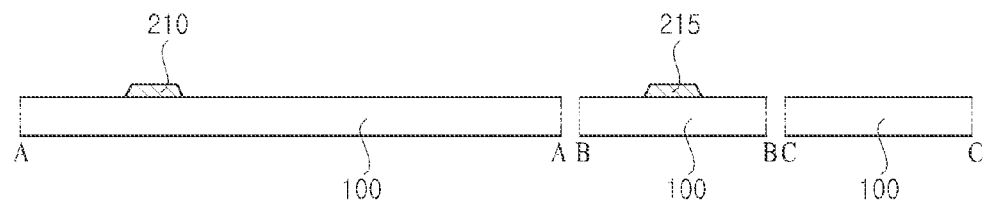
FIGS. 8A to 8I are schematic process cross-sectional views of a substrate of a display device according to another embodiment of the present invention.

First, as seen in FIG. 8A, a gate electrode 210 and a gate pattern 215 are patterned on a substrate 100. The gate electrode 210 is formed in a TFT area, and the gate pad 215 is formed in a gate pad area.

Figure 8B:
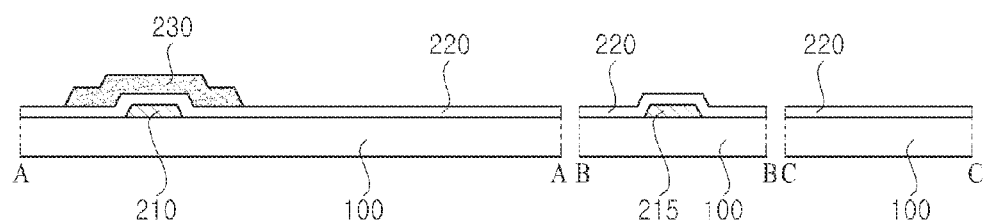

Subsequently, as seen in FIG. 8B, a gate insulating layer 220 is formed on the gate electrode 210 and the gate pad 215, and a semiconductor layer 230 is patterned on the gate insulating layer 220. The gate insulating layer 220 is formed all over the substrate 100, and the semiconductor layer 230 is formed in the TFT area.

Figure 8C:
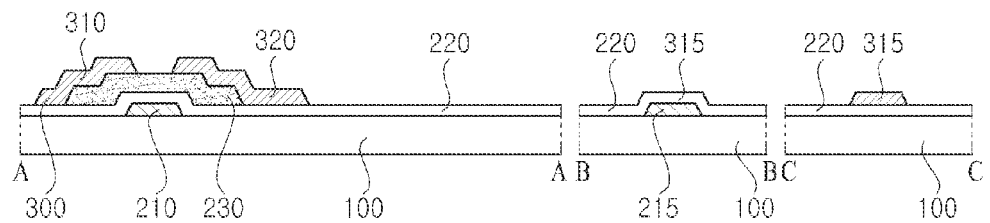

Subsequently, as seen in FIG. 8C, a source electrode 310 connected to a data line 300 and a drain electrode 320 are patterned on the semiconductor layer 230, and a data pad 315 is patterned on the gate insulating layer 220.

The source electrode 310 and the drain electrode 320 are formed in the TFT area, and the data pad 315 is formed in a data pad area.

Figure 8D:
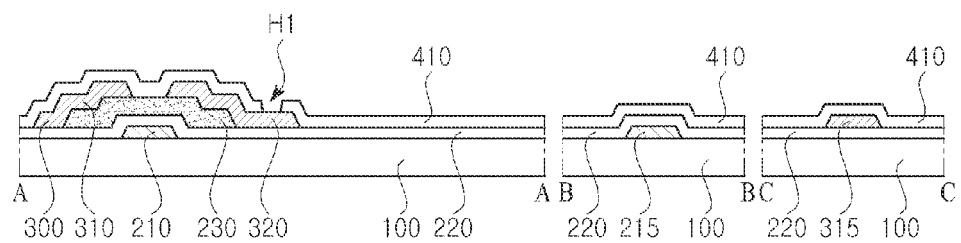

Subsequently, as seen in FIG. 8D, a first protective layer 410 is patterned on the data line 300, the data pad 315, the source electrode 310, and the drain electrode 320.

The first protective layer 120 is patterned to include a hole H1 configuring a first contact hole CH1, and is formed all over the substrate 100 except the hole H1 configuring the first contact hole CH1. The drain electrode 320 is exposed to the outside by the hole H1 included in the first protective layer 120.

The first protective layer 410 is patterned to include a hole H1 by forming the first protective layer 410 all over the substrate 100, forming a photoresist layer on the first protective layer 410, exposing the photoresist layer to a light with a mask, developing the photoresist layer to have an opening in the area corresponding the hole H1, etching the first protect layer 410 using the photoresist layer having the opening as a mask, and stripping the photoresist layer. That is, the first protective layer 410 is patterned to include a hole H1 through a photolithograpy method. Accordingly, the gate pad 215 and the data pad 315 are protected by the first protective layer 410 formed thereon in forming the hole H1.

Figure 8E:
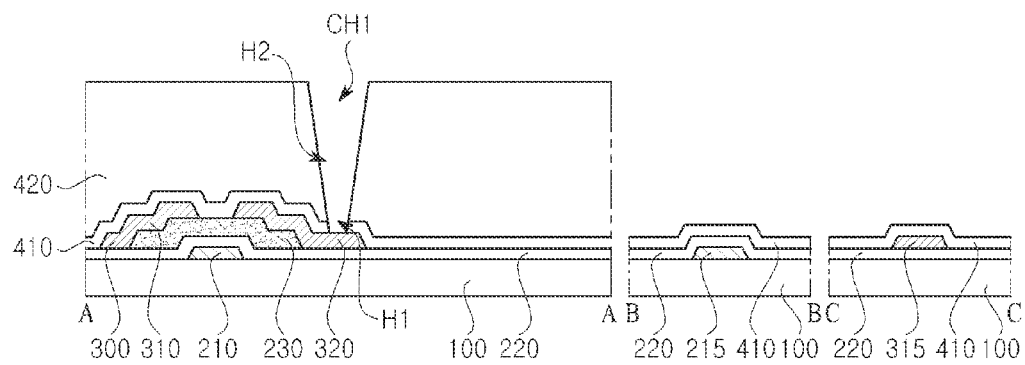

Subsequently, as seen in FIG. 8E, a second protective layer 420 is patterned on the first protective layer 410.

The second protective layer 420 is patterned to include a hole H2 configuring the first contact hole CH1, in the TFT area.

Here, the first contact hole CH1 having the structure of FIGS. 4 to 6 may be obtained by variously changing the relative sizes of the hole H1 of the first protective layer 120 and the hole H2 of the second protective layer 420. For example, in one embodiment, the hole H1 of the first protective layer 120 is etched such that it the hole H1 has a different width (e.g., a greater width or a smaller width) than the hole H2 through the second protective layer 420.

Figure 8F:
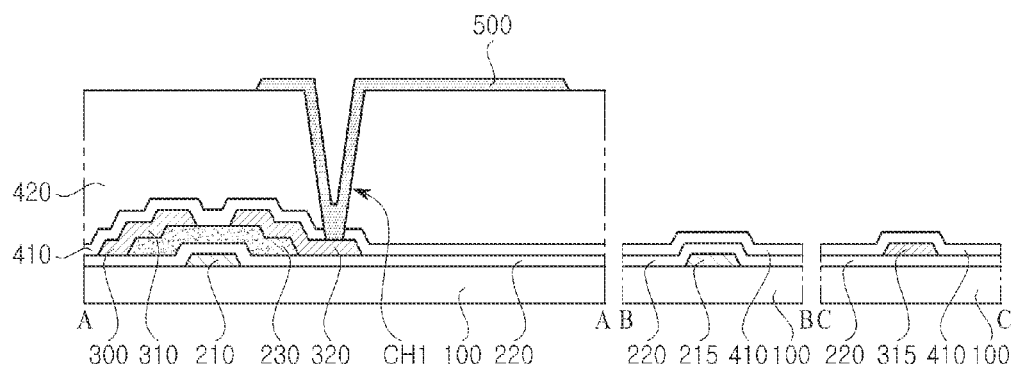

Subsequently, as seen in FIG. 8F, a pixel electrode 500 is patterned on the second protective layer 420. The pixel electrode 500 is patterned to be connected to the drain electrode 320 through the first contact hole CH1, in the TFT area.

Figure 8G:
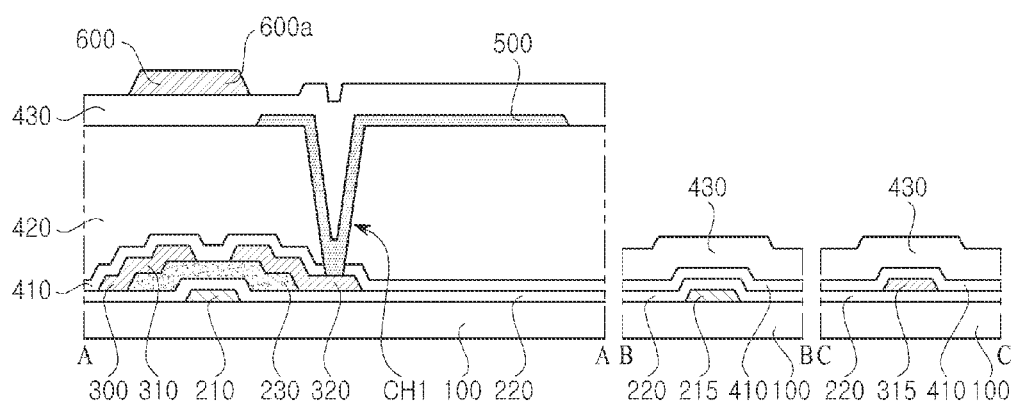

Subsequently, as seen in FIG. 8G, a third protective layer 430 is formed on the pixel electrode 500, and a sensing line 600 including a contact part 600a is patterned on the third protective layer 430.

The third protective layer 430 is formed all over the substrate 100 by the PVECVD process, and the sensing line 600 is patterned in the TFT area.

Figure 8H:
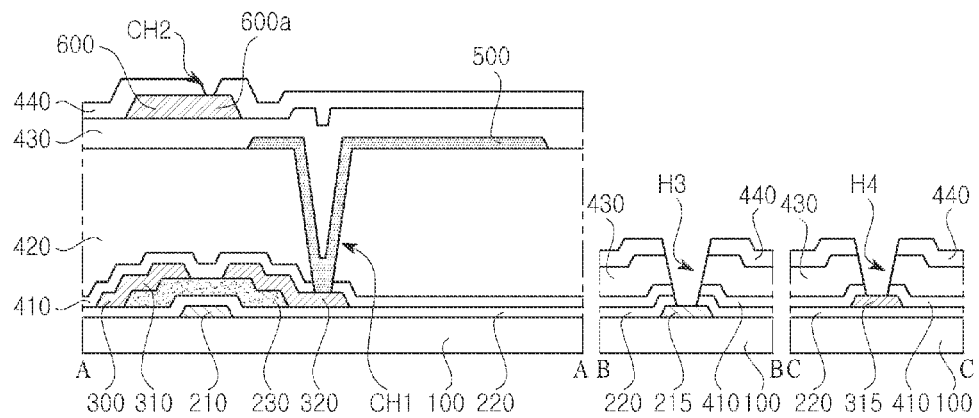

Subsequently, as seen in FIG. 8H, a fourth protective layer 440 is formed on the sensing line 600, and then, second to fourth contact holes CH2 to CH4 are formed.

The second contact hole CH2 is formed by etching a certain area of the fourth protective layer 440, and the contact part 600a of the sensing line 600 is exposed to the outside by the second contact hole CH2.

The third contact hole CH3 is formed by etching a certain area of each of the gate insulating layer 220, first protective layer 410, third protective layer 430, and fourth protective layer 440, and the gate pad 215 is exposed to the outside by the third contact hole CH3.

The fourth contact hole CH4 is formed by etching a certain area of each of the first protective layer 410, third protective layer 430, and fourth protective layer 440, and the data pad 315 is exposed to the outside by the fourth contact hole CH4.

Figure 8I:
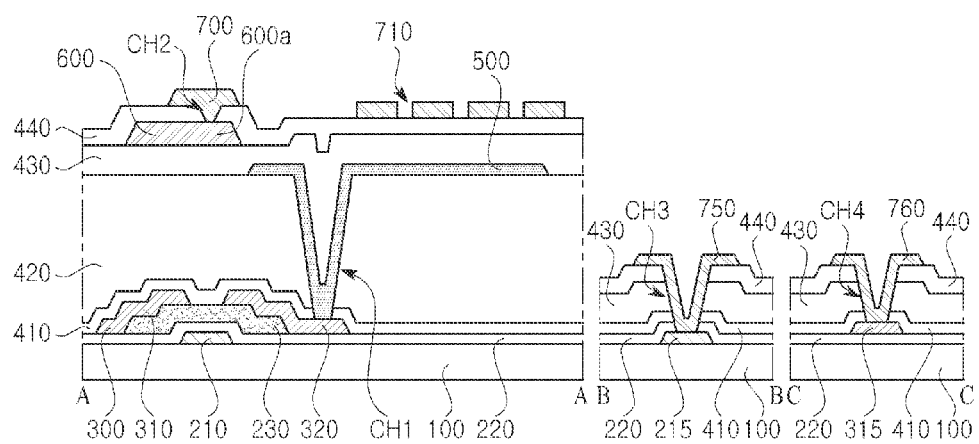

Subsequently, as seen in FIG. 8I, a common electrode 700, a gate electrode pad 750, and a data electrode pad 760 are patterned on the fourth protective layer 440.

The common electrode 700 is patterned in order for a plurality of slits 710 to be included therein, in the TFT area. In particular, the common electrode 700 is patterned to be connected to the contact part 600a of the sensing line 600 through the second contact CH2.

The gate pad electrode 750 is patterned to be connected to the gate pad 215 through the third contact hole CH3, in the gate pad area.

The data pad electrode 760 is patterned to be connected to the data pad 315 through the fourth contact hole CH4, in the data pad area.

According to FIGS. 8A to 8I, in forming the first contact hole CH1 which connects the pixel electrode 500 to the drain electrode 320, the first protective layer 410 is first patterned to include the first hole H1, and then, by patterning the second protective layer 420 so as to include the second hole H2, the first contact hole CH1 having reliability may be formed without forming a separate anti-etching layer.

Hereinabove, the substrate configuring the display device and the method of manufacturing the same have been described. However, the present invention includes various display devices (for example, an LCD device, a PDP, and an organic light emitting display device), to which the above-described substrate and the method of manufacturing the same are applied, and a method of manufacturing the same.

As described above, since the common electrode is used as the sensing electrode that senses a user's touch, a separate touch screen is not provided at the top of the display panel unlike the related art. Accordingly, a thickness decreases, a manufacturing process is simplified, and the manufacturing cost is reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
a gate line and a data line intersecting the gate line to define a pixel area on a substrate;
a thin film transistor (TFT) formed in the pixel area, and including a gate electrode, a semiconductor layer, a source electrode, and a drain electrode;
a first protective layer formed on the TFT, the first protective layer structured such that a first hole exists through the first protective layer;
a second protective layer formed on the first protective layer, and structured such that a second hole exists through the second protective layer, wherein a size of the second hole through the second protective layer at a plane where the first and second protective layers contact each other differs from a size of the first hole through the first protective layer at the plane where the first and second protective layers contact each other;
a pixel electrode formed on the second protective layer and at least partially filling the first and second holes, the pixel electrode connected to the drain electrode through the first and second holes;
a third protective layer formed on the pixel electrode;
a sensing line formed on the third protective layer;
a fourth protective layer formed on the sensing line; and
a common electrode formed on the fourth protective layer, and connected to the sensing line.

2. The display device of claim 1, wherein,
the size of the first hole is smaller than the size of the second hole, at the plane where the first and second protective layer contact each other, and wherein the pixel electrode contacts a side of the second protective layer and a top and side of the first protective layer.

3. The display device of claim 1, wherein,
the size of the first hole is greater than the size of the second hole at the plane where the first and second protective layers contacts each other, and wherein the pixel electrode contacts a side of the second protective layer without contacting the first protective layer.

4. The display device of claim 1, wherein the sensing line comprises a contact part formed over the TFT, and wherein the contact part of the sensing line connects to the common electrode.

5. The display device of claim 1, further comprising:
a plurality of additional sensing lines; and
a plurality of additional common electrodes;
wherein the plurality of additional sensing lines are connected to the plurality of additional common electrodes in a one-to-one correspondence relationship.

6. The display device of claim 1, further comprising:
a gate pad connected to one end of the gate line;
a data pad connected to one end of the data line;
a gate pad electrode formed on the fourth protective layer, and connected to the gate pad; and
a data pad electrode formed on the fourth protective layer, and connected to the data pad,
wherein the gate electrode pad and the data pad electrode are formed of a same material as the common electrode.

7. A method of manufacturing a display device, the method comprising:
forming a gate electrode and a gate pad on a substrate;
forming a gate insulating layer on the gate electrode and the gate pad;
forming a semiconductor layer on the gate insulating layer;
forming a source electrode and a drain electrode on the semiconductor layer;
forming a data pad on the gate insulating layer;
forming a first protective layer on the source electrode, drain electrode, and data pad, and forming a second protective layer, the second protective layer structured such that a hole is formed through the second protective layer;
forming an anti-etching layer on a portion of the first protective layer over the gate pad and the data pad;
etching an area of the first protective layer through the hole in the second protective layer to complete a first contact hole through the first and second protective layers;
removing the anti-etching layer;

forming a pixel electrode on the second protective layer, the pixel electrode connected to the drain electrode through the first contact hole;
forming a third protective layer on the pixel electrode;
forming a sensing line on the third protective layer;
forming a fourth protective layer on the sensing line; and
forming a common electrode, connected to the sensing line, on the fourth protective layer.

8. A method of manufacturing a display device, the method comprising:
forming a thin film transistor (TFT) on a substrate, the TFT comprising a gate electrode, a semiconductor layer, a source electrode, and a drain electrode;
forming a first protective layer structured such that a first hole exists through the first protective layer exposing the drain electrode from the first protective layer;
after the first protective layer is formed, forming a second protective layer structured such that a second hole exists through the second protective layer exposing the drain electrode from the first and second protective layers, the second hole having a different size than the first hole at a plane where the first and second protective layers contact each other; and
forming a pixel electrode on the second protective layer, the pixel electrode connected to the drain electrode through the first and second holes;
forming a third protective layer on the pixel electrode;
forming a sensing line on the third protective layer;
forming a fourth protective layer on the sensing line; and
forming a common electrode, connected to the sensing line, on the fourth protective layer.

9. The method of claim 8, further comprising forming a gate pad and a data pad, the gate pad and the data pad being protected by the first protective layer thereon in forming the first hole.

10. The method of claim 8,
wherein forming the second protective layer comprises forming the second protective layer to have a structure such that the second hole has a larger width than the first hole at a plane where the first and second protective layers meet, and
wherein forming the pixel electrode comprises forming the pixel electrode to contact a side of the second protective layer and a top and side of the first protective layer.

11. The method of claim 8,
wherein forming the second protective layer comprises forming the second protective layer to have a structure such that the second hole has a smaller width than the first hole at a plane where the first and second protective layers meet, and
wherein forming the pixel electrode comprises forming the pixel electrode to contact a side of the second protective layer without contacting the first protective layer.

* * * * *